(12) United States Patent  
Mohamadi

(10) Patent No.: US 7,423,607 B2  
(45) Date of Patent: Sep. 9, 2008

(54) SWITCHING POWER AMPLIFIER AND DAC FOR AN ELECTRONICALLY-SCANNED ARRAY

(76) Inventor: Farrokh Mohamadi, 8 Halley, Irvine, CA (US) 92612-3797

( * ) Notice: Subject to any disclaimer, the term of this patent is extended or adjusted under 35 U.S.C. 154(b) by 0 days.

(21) Appl. No.: 11/834,530

(22) Filed: Aug. 6, 2007

(65) Prior Publication Data

US 2008/0079652 A1    Apr. 3, 2008

Related U.S. Application Data

(63) Continuation-in-part of application No. 11/616,235, filed on Dec. 26, 2006, which is a continuation-in-part of application No. 11/536,625, filed on Sep. 28, 2006.

(51) Int. Cl.
*H01Q 21/00* (2006.01)

(52) U.S. Cl. .............................. 343/853; 343/700 MS; 343/893; 342/371

(58) Field of Classification Search .......... 343/700 MS, 343/853, 893; 342/371, 375
See application file for complete search history.

(56) References Cited

U.S. PATENT DOCUMENTS 6,754,471 B1 *  6/2004  Vakilian ...................... 455/73
6,876,846 B2 *  4/2005  Tamaki et al. ............... 455/403
7,286,804 B2 * 10/2007  Miyagi et al. ............ 455/169.1

OTHER PUBLICATIONS

Farrokh Mohamadi, Wafer Scale Integration of Active Antenna Array, RF Design, Feb. 2005, pp. 48-64, USA.
Farrokh Mohamadi, Si Integration with Millimeter Wave Phased Array Antenna, RF Design, Feb. 2004, pp. 40-48, USA.
Farrokh Mohamadi, Locator Beacon Design for Victims in Distress, RF Design, Mar. 2004, pp. 28-36, USA.
F.H. Raab, et al., Power Amplifiers and Transmitters for RF and Microwave, IEEE Transactions on Microwave Theory and Techniques, Mar. 2002, vol. 50 No. 3.
N.O. Sokal and A.D. Sokal, Class E, a New Class of High-Efficiency Tuned Single-Ended Power Amplifiers, IEEE J. Solid-State Circuits, Jun. 1975, pp. 168-176, vol. SC10.

* cited by examiner

*Primary Examiner*—Tan Ho
(74) *Attorney, Agent, or Firm*—Jonathan W. Hallman; MacPherson Kwok Chen & Heid LLP

(57) ABSTRACT

In one embodiment, an integrated circuit antenna array is provided that includes: a low-voltage substrate; a high-voltage substrate; a digital-to-analog converter (DAC) integrated with the low-voltage substrate, the DAC being operable to receive a digital command and convert it into an analog voltage; a voltage-controlled oscillator (VCO) integrated with the low-voltage substrate, the VCO providing an RF signal having an output frequency responsive to the analog voltage; a plurality of switching power amplifiers integrated with the high-voltage substrate, each switching power amplifier receiving an RF signal from the low-voltage substrate and providing an amplified RF output signal; and a plurality of antennas adjacent the high-power substrate, each antenna associating with a corresponding one of the switching power amplifier so as to transmit the amplified RF output signal from the corresponding switching power amplifier.

14 Claims, 5 Drawing Sheets

SWITCHING POWER AMPLIFIER AND DAC FOR AN ELECTRONICALLY-SCANNED ARRAY

RELATED APPLICATION

This application is a continuation-in-part of U.S. application Ser. No. 11/616,235 filed Dec. 26, 2006, which in turn is a continuation-in-part of U.S. application Ser. No. 11/536,625, filed Sep. 28, 2006.

TECHNICAL FIELD

The present invention relates generally to integrated circuits, and more particularly to an integrated beamforming array.

BACKGROUND

Conventional beamforming systems are often cumbersome to manufacture. In particular, conventional beamforming antenna arrays require complicated feed structures and phase-shifters that are impractical to be implemented in a semiconductor-based design due to its cost, power consumption and deficiency in electrical characteristics such as insertion loss and quantization noise levels. In addition, such beamforming arrays make digital signal processing techniques cumbersome as the operating frequency is increased. Moreover, at the higher data rates enabled by high frequency operation, multipath fading and cross-interference becomes a serious issue. Adaptive beamforming techniques are known to combat these problems. But adaptive beamforming for transmission at 10 GHz or higher frequencies requires massively parallel utilization of A/D and D/A converters.

To provide a beamforming system compatible with semiconductor processes, the applicant has provided a number of integrated antenna architectures. For example, U.S. application Ser. No. 11/454,915 discloses a beamforming system in which an RF signal is distributed through a transmission network to integrated antenna circuits that include a beamforming circuit that adjusts the phase and/or the amplitude of distributed RF signal responsive to control from a controller/phase manager circuit. In a receive configuration, each beamforming circuit adjusts the phase and/or the amplitude of a received RF signal from the corresponding integrated circuit's antenna and provides the resulting adjusted received RF signal to the transmission network. Although such integrated antenna circuits consume a relatively small amount of power, transmission loss is incurred through the resulting RF propagation in the transmission network. To account for such loss, U.S. application Ser. No. 11/454,915 discloses a distributed amplification system such that RF signals propagated through the transmission network are actually amplified rather than attenuated. However, the transmission network introduces dispersion as well.

To avoid the dispersion introduced by an RF transmission network, an alternative integrated circuit (which may also be denoted as an integrated oscillator circuit) has been developed such as disclosed in U.S. Pat. No. 6,982,670. For example, each integrated oscillator/antenna circuit may include an oscillator such as a phase-locked loop (PLL) and a corresponding antenna and mixer. In such an embodiment, each PLL is operable to receive a reference signal and provide a frequency-shifted signal output signal that is synchronous with the reference signal. Should an integrated oscillator/antenna circuit be configured for transmission, its output signal is upconverted in the unit's mixer and the upconverted signal transmitted by the corresponding antenna. Alternatively, should an integrated oscillator/antenna circuit be configured for reception, a received RF signal from the unit's antenna is downconverted in the mixer responsive to the frequency-shifted output signal from the PLL.

SUMMARY

In accordance with an aspect of the invention, an integrated circuit antenna array is provided that includes: a low-voltage substrate; a high-voltage substrate; a digital-to-analog converter (DAC) integrated with the low-voltage substrate, the DAC being operable to receive a digital command and convert it into an analog voltage; a voltage-controlled oscillator (VCO) integrated with the low-voltage substrate, the VCO providing an RF signal having an output frequency responsive to the analog voltage; a plurality of switching power amplifiers integrated with the high-voltage substrate, each switching power amplifier receiving an RF signal from the low-voltage substrate and providing an amplified RF output signal; and a plurality of antennas adjacent the high-power substrate, each antenna associating with a corresponding one of the switching power amplifier so as to transmit the amplified RF output signal from the corresponding switching power amplifier.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To provide a high performance array that is compatible with an integrated circuit approach, a dual-substrate antenna array is disclosed. RF signal generation is performed in a silicon-based substrate. To provide high power operation, a high-bandgap substrate (which may also be denoted as a high-voltage substrate) supports switching power amplifiers that amplify the RF signal from the silicon-based substrate for transmission through corresponding antennas supported by the high-voltage substrate. The low-voltage substrate and its associated circuits will be discussed first.

Figure 1:
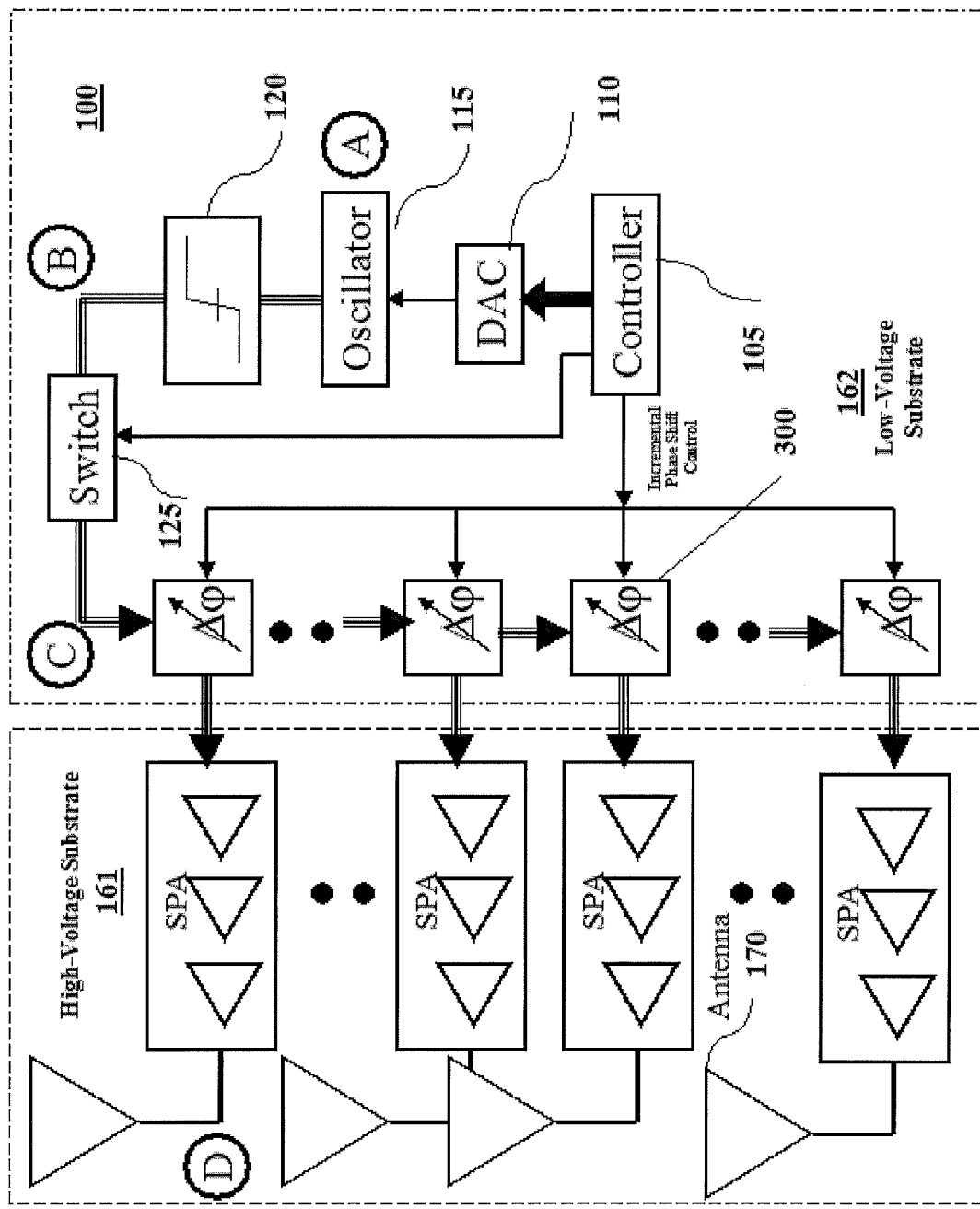
FIG. 1 is a block diagram of an integrated circuit antenna array having a high-bandgap substrate supporting a plurality of antennas and switching power amplifiers that amplify RF signal from a silicon-based substrate including a VCO whose output RF signals have a frequency responsive to an analog voltage from a digital-to-analog converter (DAC).

The Low-Voltage Substrate:

FIG. 1 illustrates an example integrated circuit antenna array 100. A silicon-based substrate such as silicon or silicon-germanium forms the low-voltage substrate. Integrated into the low-voltage substrate is a controller 105 that provides a digital control signal to a digital-to-analog converter (DAC) 110. A resulting analog control signal form the DAC then controls the frequency of oscillation for a voltage-controlled oscillator (VCO) 115. A non-linear circuit 120 such as a high-gain comparator or a Schmitt trigger transforms the sinusoidal output from the VCO into a rectified output to provide a rectified on/off switching signal. The resulting waveform that alternates between ground and a power supply voltage enable the switching power amplifiers to deliver higher efficiency in power conversion. To enable the formation of pulses, the rectified on/off switching signal from the VCO may be gated at a switch 125 responsive to commands from controller 105. The gated on/off switching signal from switch 125 may then be distributed to a plurality of phase-shifters 130. Each phase-shifter provides a phase-shifted output signal responsive to commands from controller 105.

The input voltage to the VCO should vary significantly across its tuning range. In that regard, most high-speed DACs are implemented using current-steering architectures in which the output voltage swing is quite limited. To provide a wider tuning range, DAC 110 may be implemented using a rail-to-rail resistor-ladder architecture. For example, DAC 110 may comprise a 4-bit or 6-bit rail-to-rail resistor-ladder DAC. The resulting analog voltage from the DAC controls VCO 110, which may be implemented as shown in FIG. 2.

Figure 2:
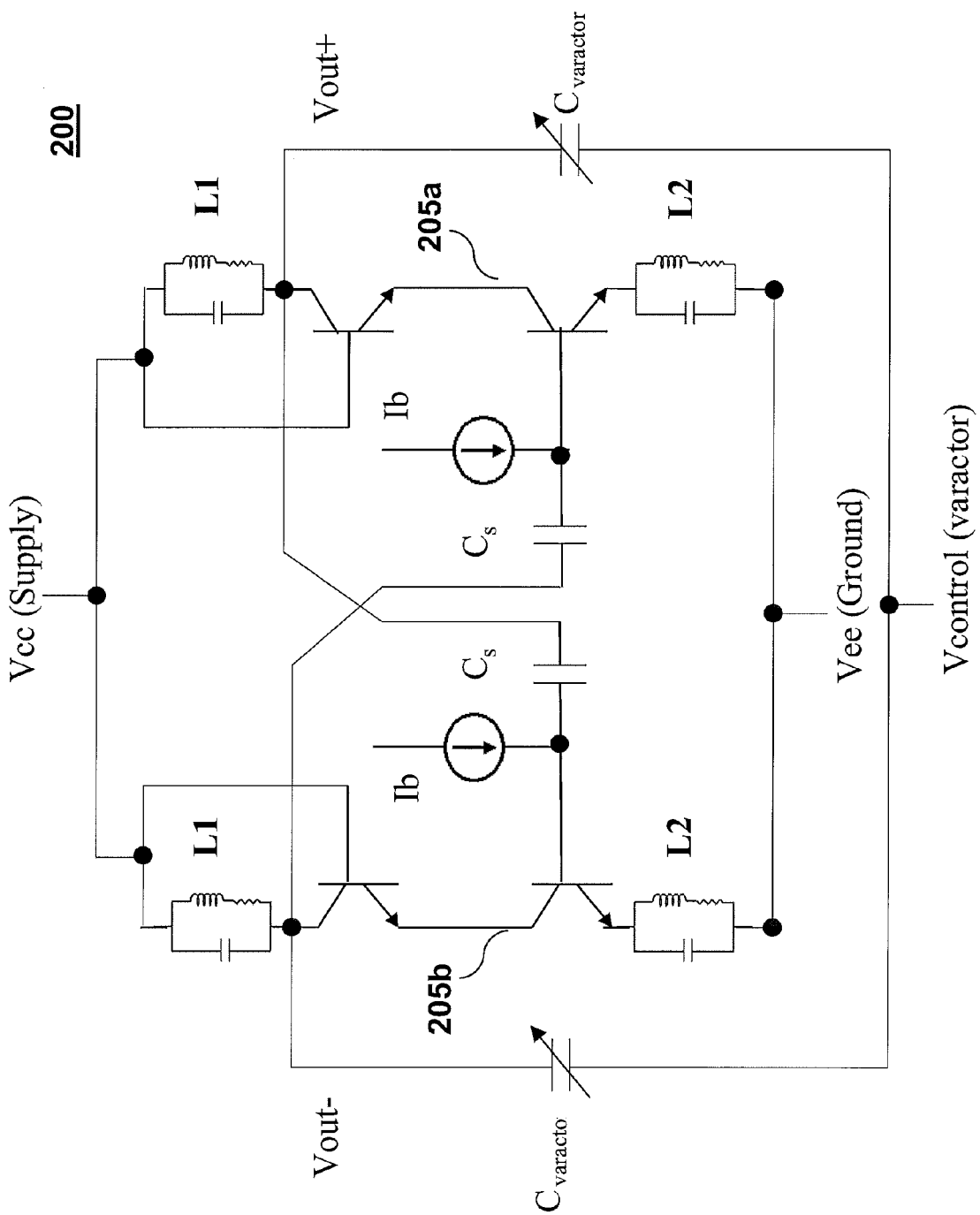
FIG. 2 is a schematic illustration of an example VCO for the integrated circuit antenna array of FIG. 1.

FIG. 2 illustrates an example VCO 200 having one or more varactors (represented as capacitors $C_{varactor}$) whose capacitance is controlled by the analog voltage from DAC 110 (represented as Vcontrol). VCO 200 includes two cross-coupled amplifiers 205 driving each other in a complementary fashion so as to induce the desired oscillation. Each amplifier 205 may include two serially-connected transistors. The collector of the upper transistor (or source if each transistor is a PMOS transistor instead of a BJT) in each amplifier couples to a power supply node through an integrated inductor L1. Similarly, the emitter of the lower transistor in each amplifier couples to ground through an integrated inductor L2. Each inductor may be formed using integrated circuit metal layers as discussed, for example, in U.S. Pat. No. 6,963,307, the contents of which are incorporated by reference. A first amplifier 205a provides an output voltage Vout+ that is received as an input voltage to a second amplifier 205b through a DC-blocking capacitor $C_s$. The second amplifier provides an output voltage Vout—that is received as an input voltage to the first amplifier through another DC-blocking capacitor. Each amplifier is biased by a current source Ib. It may be shown that VCO 200 will have an output frequency ω approximately equaling $1/sqrt(L*C_{varactor})$, where L is the equivalent inductance of inductor L1 and its associated parasitic inductances. Thus, as DAC 110 changes the voltage Vcontrol responsive to commands form controller 105, the output frequency for the VCO may be adjusted as necessary.

To assure stability, it may be necessary to adjust L2 or L1 for one of the amplifiers such that the amplifiers become slightly asymmetric.

Each phase-shifter 300 may be implemented using any suitable digital phase shifter (a discrete set of achievable phase shifts) or analog phase shifter (a continuously variable phase shift). A particularly advantageous analog phase shifter is disclosed in U.S. patent application Ser. No. 11/535,928, the contents of which are incorporated by reference herein. It will be appreciated that a less complicated design may be achieved if the phase-shifters are omitted.

Figure 3:
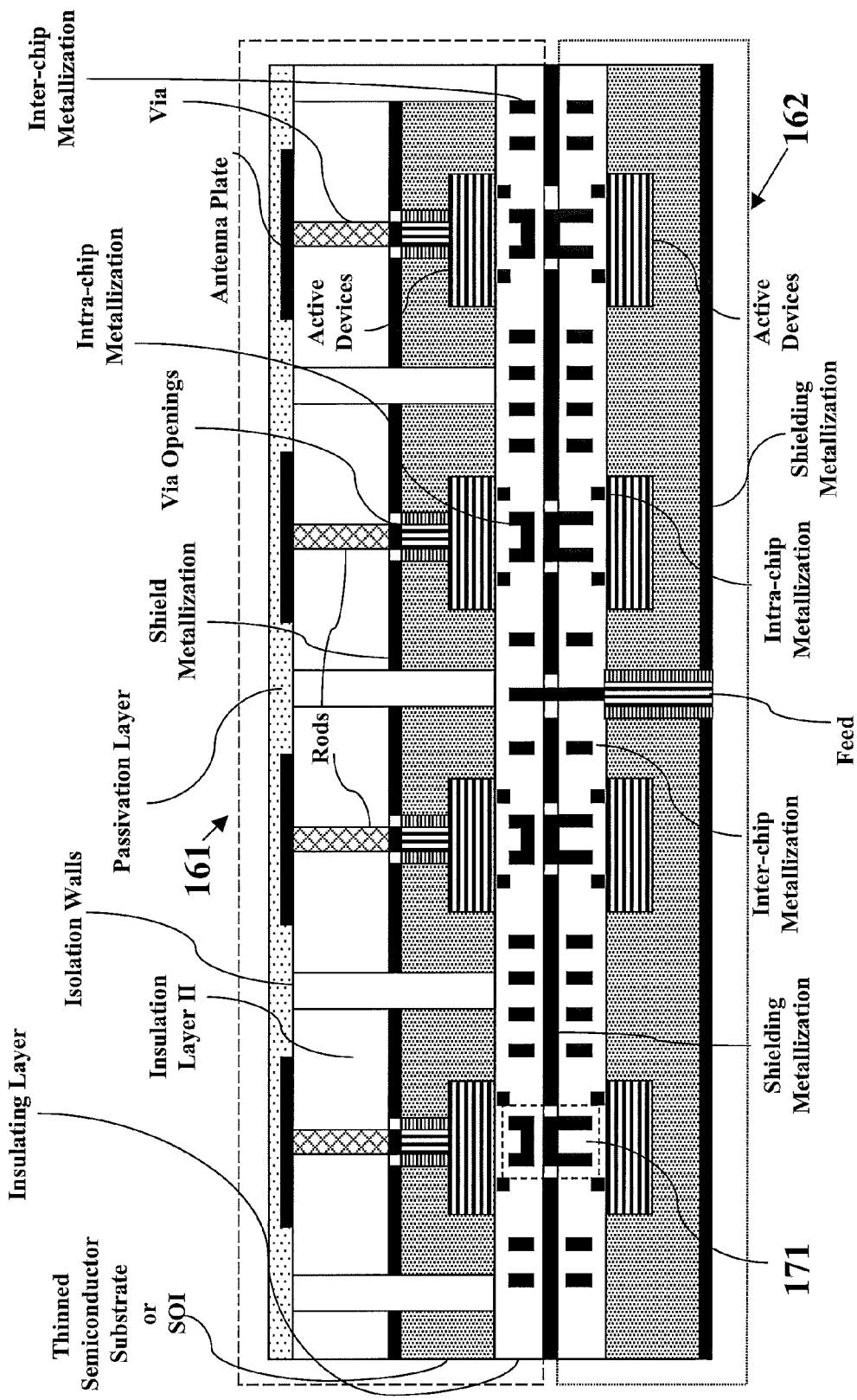
FIG. 3 illustrates a cross-sectional view for a first embodiment of the integrated circuit antenna array of FIG. 1.

The High-voltage Substrate:

As discussed in U.S. patent application Ser. No. 11/536,625, (the '625 application) an inductive coupling may be used to couple the RF signal from the phase-shifters (if implemented) to the high voltage substrate. Alternatively, an ohmic coupling may be used. As further discussed in the '625 application, if a transformer coupling is used such that a primary coil is formed in metal layers on the low-voltage substrate that couples to a secondary coil formed in metal layers on the high-voltage substrate, the separation between the coils should be minimized to enhance signal coupling. This minimization may be achieved through a patterning of the final passivation layer that covers the final metal layer (such as M8 in an 8 metal layer process). The final passivation layer is flattened using, for example, chemical-mechanical polishing to an acceptable tolerance. A metal such as copper may then be patterned onto the flattened surface such that a final coil for either the primary or the secondary is formed in the patterned metal. These final coils are isolated from the remaining metal that plates the flattened final passivation layer. The resulting cross-section for an example coupling is shown in FIG. 3. A low-voltage substrate 162 includes active devices that form the components discussed with regard to FIG. 1. These components drive an RF signal into primary coils 171 that have a final coil formed in the metal layer that coats the flattened final passivation layer. The corresponding metal layer for a high-voltage substrate 161 is patterned to include a window to receive the final primary coil. The substrates may then be heated and/or vibrated such that the metal layer covering the final passivation layers alloy together to thereby secure the substrates to each other.

Figure 4:
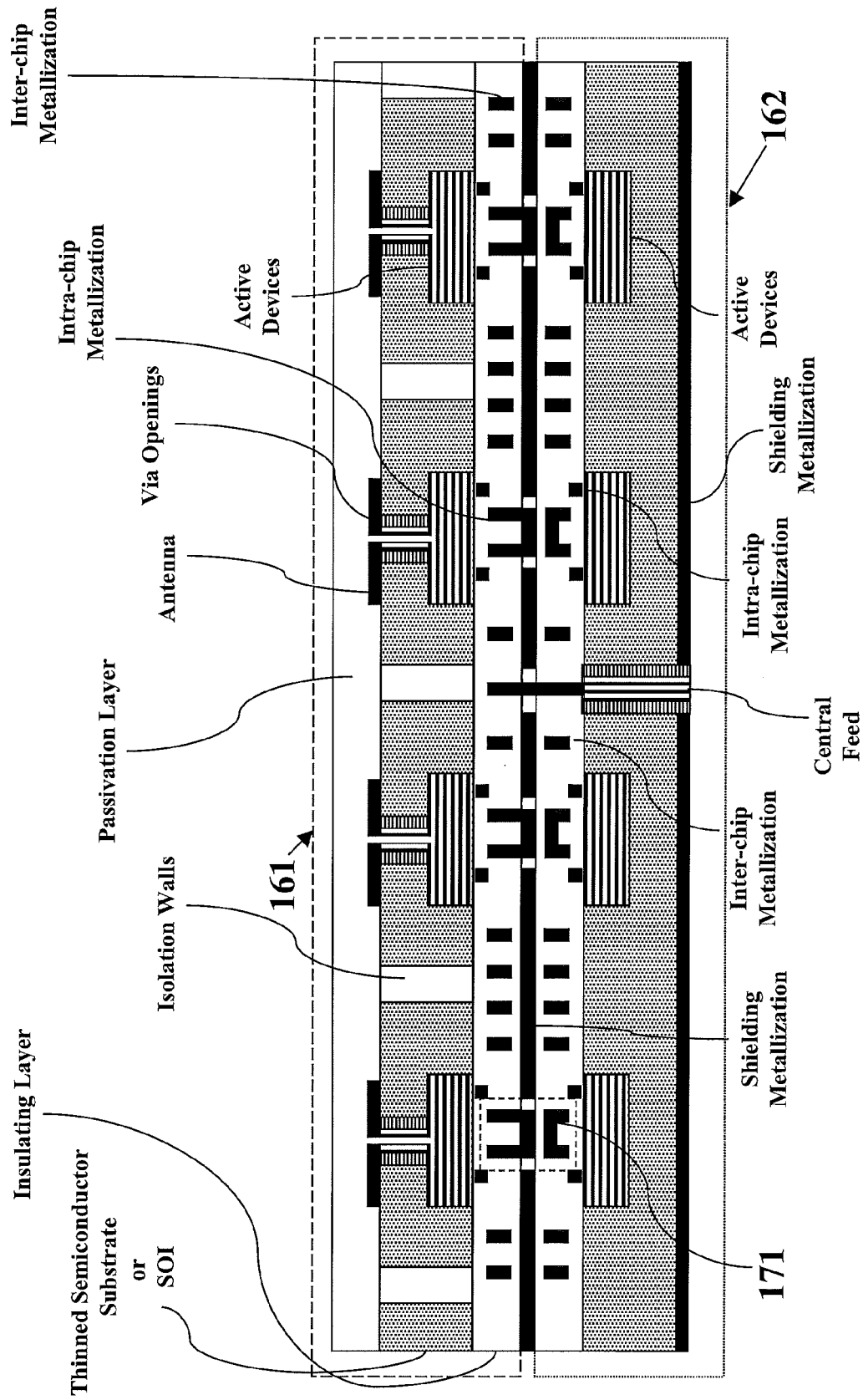
FIG. 4 illustrates a cross-sectional view for a second embodiment of the integrated circuit antenna array of FIG. 1.

An alternative embodiment is shown in FIG. 4 where the metal layers covering the final passivation layers are instead patterned to form a final coil for the secondary rather than the primary. Regardless of how the final coil is formed so as to minimize the separation between the primary and secondary, the high-voltage substrate will need power. In one embodiment, the power may be supplied from the low-voltage substrate through a deep diffusion region such as the central feed shown in FIGS. 3 and 4. The high-voltage substrate may comprise a semiconductor having a suitable large bandgap such as such as gallium arsenide, indium phosphide, or gallium nitride. In this fashion, voltages as high as 30V may be supported within the high-voltage substrate. To take advantage of such achievable voltages, the high-voltage substrate may include switching power amplifiers (SPAs) 180 as shown in FIG. 1. Each SPA associates with a phase-shifter (if implemented) so as to receive the resulting RF signal and amplify it before transmission through an associated antenna 170. Each antenna may be constructed using any desired topology such as a patch or dipole antenna. For example, the antennas may be horn antennas as disclosed in U.S. application Ser. No. 11/774,476, the contents of which are incorporated by reference. Alternatively, the antennas may comprise a logperiodic antenna array as disclosed in U.S. application Ser. No. 11/470,720, the contents of which are incorporated by reference.

A switching power amplifier offers high efficiencies since the transistors are ideally either fully on or fully off. Switching power amplifiers may be classified into two classes. A first class, designated as class E, use reactive networks to shape the switch voltage and current during turn-on and turn-off cycles. A second class, designated as class F, use transmission lines to transform the input impedances into a reciprocal of the termination impedance. Of the two classes, class E SPAs can achieve greater efficiencies. However, class F SPAs may be designed to offer advantageous square-wave output signals. Accordingly, whether SPAs 180 are implemented using a class E or class F switching power amplifier depends upon the desired design and operating goals. Regardless of what class switching power amplifier is used, significantly greater transmission power is achieved because of the higher voltages supported in a high-bandgap substrate.

Figure 5:
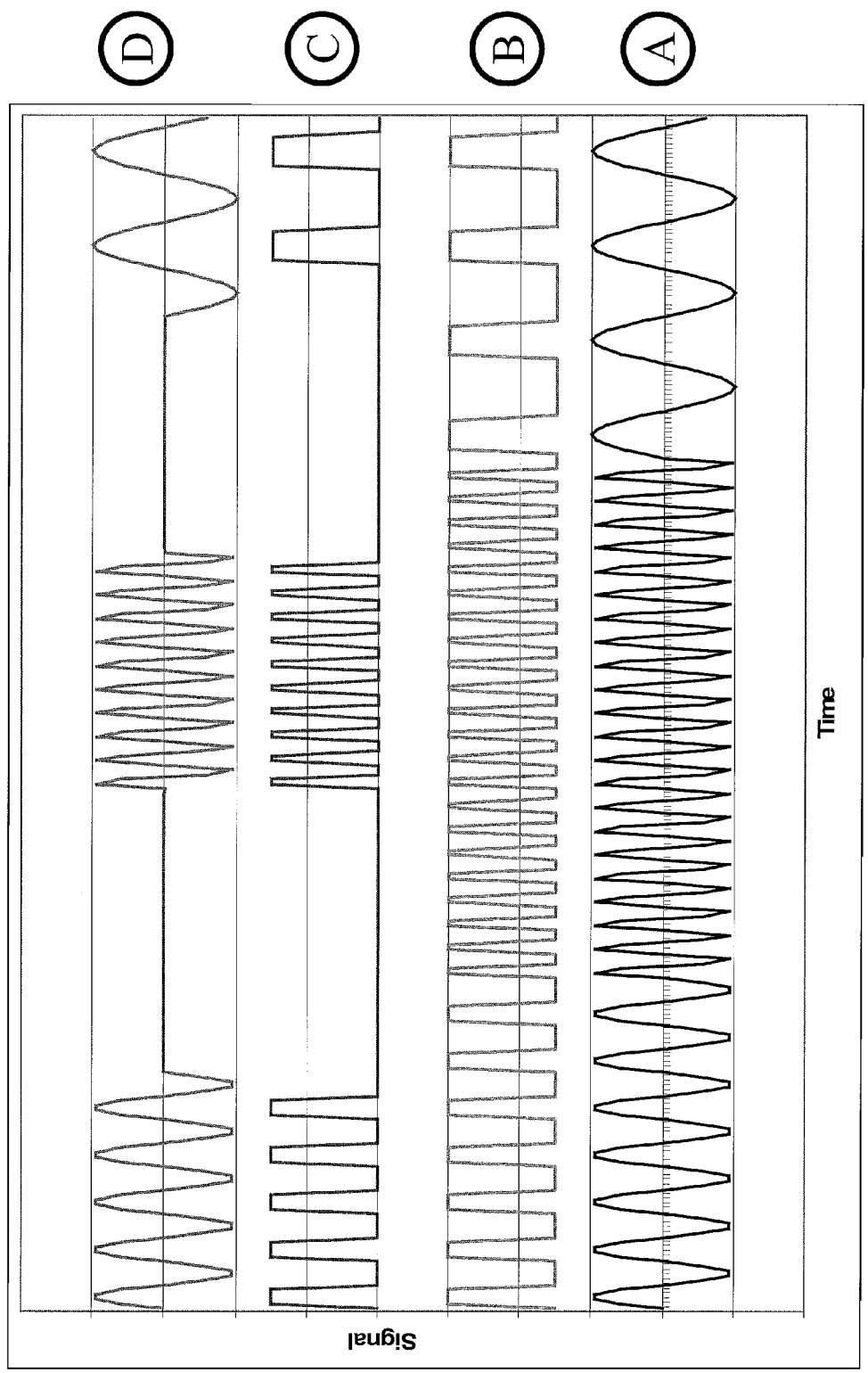
FIG. 5 illustrates a variety of waveforms within the integrated circuit antenna array of FIG. 1.

Turning now to FIG. 5, several waveforms within integrated circuit antenna array 100 are shown. Waveform A represents the frequency-modulated sinusoidal RF signal produced by VCO 115. Waveform B represents the rectified substantially on/off signal from non-linear circuit 120. This signal is then gated through switch 125 as shown by waveform C. The gated on/off signal then drives the power switch within the corresponding switching power amplifier to produce sinusoidal RF pulses shown by waveform D.

It will be obvious to those skilled in the art that various changes and modifications may be made without departing from this invention in its broader aspects. For example, integrated circuit antenna array 100 may be simplified to include just four SPAs that drive four corresponding antennas. The SPAs may be driven directly from switch 125 such that no phase-shifters (and hence no beamsteering capabilities) are provided. Such a simplified array may be used as a beacon-on-demand (BOD) unit. Each BOD may be assigned a unique code that is modulated onto the transmitted signal through operation of switch 125. The appended claims encompass all such changes and modifications as fall within the true spirit and scope of this invention.

I claim:

1. An integrated circuit antenna array, comprising:
   a low-voltage substrate;
   a high-voltage substrate;
   a digital-to-analog converter (DAC) integrated with the low-voltage substrate, the DAC being operable to receive a frequency command and convert it into an analog voltage;
   a voltage-controlled oscillator (VCO) integrated with the low-voltage substrate, the VCO providing an RF signal having an output frequency responsive to the analog voltage;
   a plurality of switching power amplifiers integrated with the high-voltage substrate, each switching power amplifier receiving an on/off RF signal from the low-voltage substrate and providing an amplified RF output signal; and
   a plurality of antennas adjacent the high-voltage substrate corresponding to the plurality of switching power amplifiers, each antenna being operable to transmit the amplified RF output signal from its corresponding switching power amplifier.

2. The integrated circuit antenna array of claim 1, further comprising:
   a non-linear circuit operable to rectify the RF signal from the VCO into a substantially on/off RF signal; and
   a switch operable to gate the substantially on/off RF signal into gated pulses responsive to a gating command.

3. The integrated circuit antenna array of claim 2, further comprising:
   a plurality of phase-shifters corresponding to the plurality of switching power amplifiers, each phase-shifter being operable to phase-shift the gated pulses into phase-shifted gated pulses responsive to a phase-shifting command signal, wherein the on/off signal received by each switching power amplifier corresponds to the phase-shifted gated pulses from its corresponding phase-shifter.

4. The integrated circuit antenna array of claim 3, wherein the high-voltage substrate has a first surface facing a first surface of the low-voltage substrate, and wherein the antennas are adjacent a second opposing surface of the high-voltage substrate.

5. The integrated circuit antenna array of claim 4, wherein the switching power amplifiers are adapted to receive the on/off RF signal through transformers.

6. The integrated circuit antenna array of claim 5, wherein each transformer has a primary coil formed in metal layers adjacent the first surface of the low-voltage substrate and a secondary coil formed in metal layers adjacent the first surface of the high-voltage substrate.

7. The integrated circuit antenna array of claim 6, wherein the metal layers adjacent the first surface of the high-voltage substrate have an overlaying passivation layer and a final metal layer deposited on the overlaying passivation layer, and wherein the metal layers adjacent the first surface of the low-voltage substrate have an overlaying passivation layer and a final metal layer deposited on the overlaying passivation layer, the final metal layers being alloyed together to bond the high-voltage substrate to the low-voltage substrate.

8. The integrated circuit antenna array of claim 4, wherein the switching power amplifiers are adapted to receive the on/off RF signal through ohmic contacts.

9. The integrated circuit antenna array of claim 3, further comprising at least one controller integrated with the low-voltage substrate, the at least one controller being operable to provide the frequency command, the gating command, and the phase-shifting commands.

10. The integrated circuit antenna array of claim 3, wherein the VCO includes a varactor having a capacitance that is responsive to the analog voltage.

11. The integrated circuit antenna array of claim 10, wherein the VCO further includes a pair of cross-coupled amplifiers.

12. The integrated circuit antenna array of claim 1, wherein each switching power amplifier is a class E switching power amplifier.

13. The integrated circuit antenna array of claim 1, wherein each switching power amplifier is a class F switching power amplifier.

14. The integrated circuit antenna array of claim 1, wherein the low-voltage substrate comprises silicon germanium and wherein the high-voltage substrate is selected from the group consisting of gallium arsenide, indium phosphide, and gallium nitride.

* * * * *